United States Patent [19]

Kolom

[11] Patent Number: 5,054,635

[45] Date of Patent: Oct. 8, 1991

[54] RAPID ASSEMBLY AND LOAD DISTRIBUTION SYSTEM FOR NESTABLE CONTAINER SECTIONS

[75] Inventor: Aaron L. Kolom, Los Angeles, Calif.

[73] Assignee: Alcoa/Tre, Inc., Los Angeles, Calif.

[21] Appl. No.: 532,187

[22] Filed: Jun. 1, 1990

Related U.S. Application Data

[63] Continuation of Ser. No. 138,594, Dec. 28, 1987, abandoned, which is a continuation-in-part of Ser. No. 926,283, Feb. 5, 1986, abandoned.

[51] Int. Cl.$^5$ .............. B64D 37/12; B65D 8/04
[52] U.S. Cl. ................. 220/4.15; 220/4.16; 220/4.34; 244/135 R
[58] Field of Search .............. 220/5 A, 5 R, 4 B, 4 E, 220/692, 693, 682, 683, 4.07–4.09, 4.14–4.17, 4.33, 4.34; 217/65, 69; 244/135 R, 135 B

[56] References Cited

U.S. PATENT DOCUMENTS

| | | | |
|---|---|---|---|
| 704,366 | 7/1902 | Phillips | 220/80 |
| 967,630 | 8/1910 | George | 220/80 |
| 2,373,221 | 4/1945 | Blaylock | 220/5 A |
| 2,530,481 | 11/1950 | Rawn | 220/80 |
| 2,545,481 | 3/1951 | Maier | 220/80 |
| 2,644,553 | 7/1953 | Cushman | 220/75 |
| 2,648,454 | 8/1953 | Dean | 220/80 |
| 2,661,115 | 12/1953 | Fletcher | 220/5 A |
| 2,678,750 | 5/1954 | King | 220/5 A |
| 2,686,609 | 8/1954 | Fletcher | 220/57 |
| 2,743,029 | 4/1956 | Mautner | 217/65 |
| 2,770,386 | 11/1956 | Mitchell | 220/76 |
| 2,781,935 | 2/1957 | Spieth | 220/80 |
| 2,815,713 | 10/1957 | Lankford | 220/81 R |
| 2,823,826 | 2/1958 | Moore | 220/80 |
| 2,837,365 | 6/1958 | Schlueter | 220/81 R |
| 2,895,635 | 7/1959 | Pollard | 220/81 R |
| 2,903,968 | 9/1959 | Berliner | 220/5 A |
| 2,919,045 | 12/1959 | Waugh | 220/4 F |
| 3,161,384 | 12/1964 | Czerwenda | 220/5 A |
| 3,241,701 | 3/1966 | Boggs | 220/80 |
| 3,285,628 | 11/1966 | DeVries | 220/80 |
| 3,469,730 | 9/1969 | Neff | 220/5 A |
| 3,653,531 | 4/1972 | Zurmuehlem | 220/5 A |
| 3,819,079 | 6/1974 | Levens | 220/5 A |
| 4,271,975 | 6/1981 | Ketner | 220/80 |
| 4,790,350 | 12/1988 | Arnold . | |

FOREIGN PATENT DOCUMENTS

| | | | |
|---|---|---|---|
| 483588 | 5/1952 | Canada | 220/5 A |
| 1021784 | 12/1957 | Fed. Rep. of Germany | 220/5 A |
| 148598 | 7/1920 | United Kingdom | 220/75 |
| 786197 | 11/1957 | United Kingdom | 220/5 A |

OTHER PUBLICATIONS

Application file of abandoned U.S. patent application Ser. No. 826,160 to Arnold, filed Feb. 4, 1986.

*Primary Examiner*—Stephen Marcus
*Attorney, Agent, or Firm*—Spensley Horn Jubas & Lubitz

[57] ABSTRACT

An aircraft external fuel tank is disclosed which is comprised of nestable sections held together by a hinge joint comprised of a plurality of knuckles coupled by a pin inserted through the knuckles. The fuel tank may be rapidly assembled and disassembled, thereby minimizing storage space requirements while maximizing the ability to deploy the tanks to the aircraft.

15 Claims, 3 Drawing Sheets

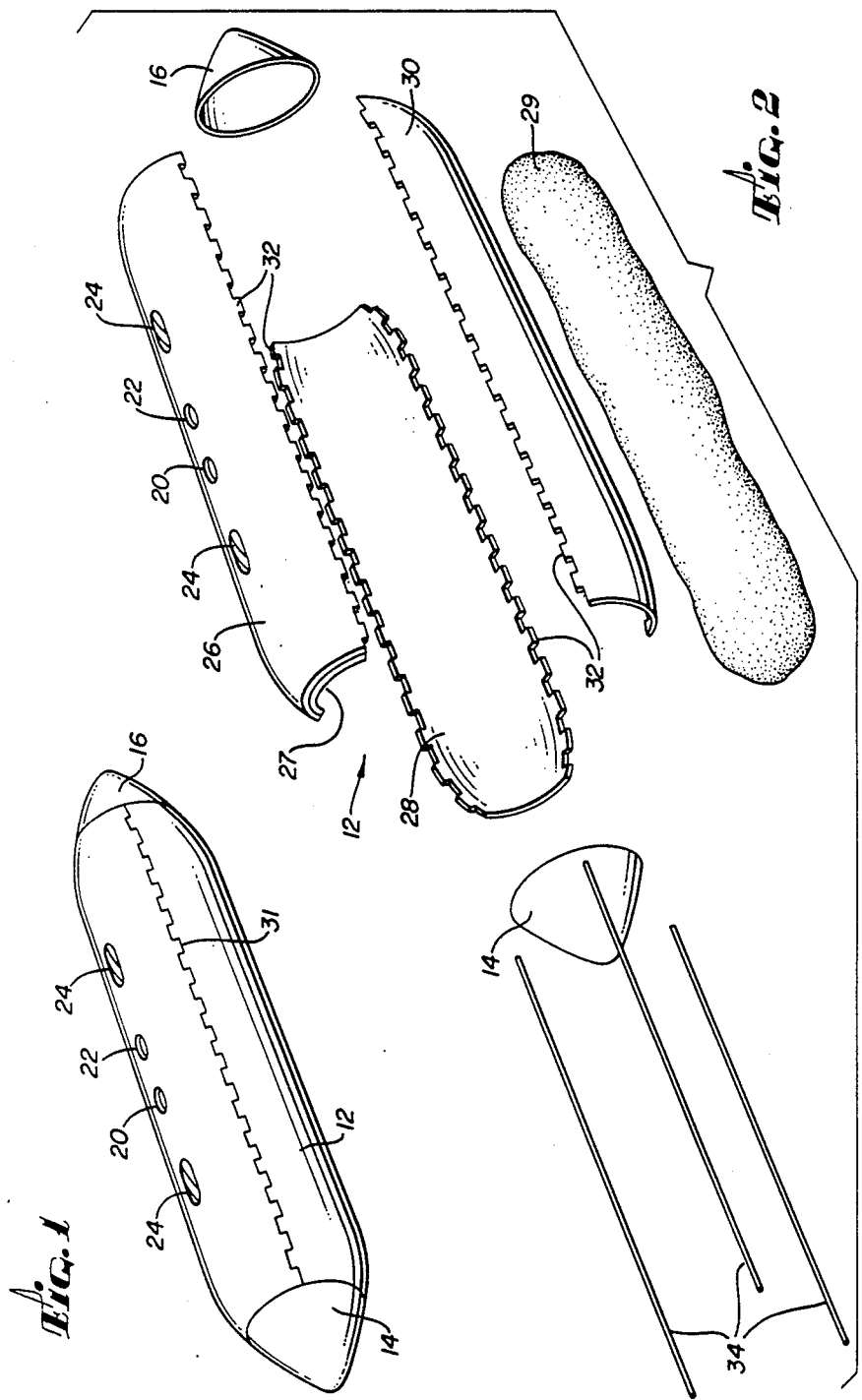

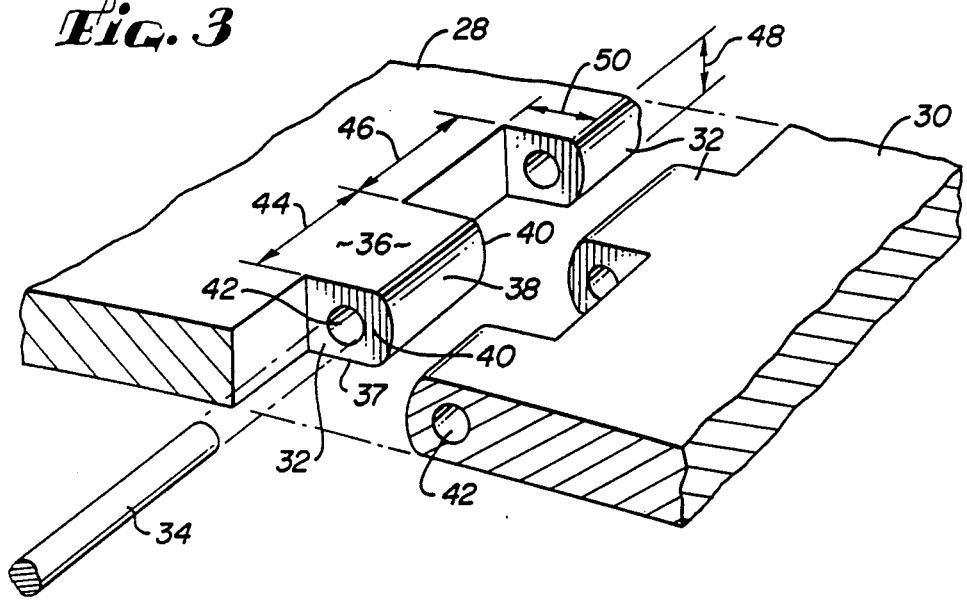
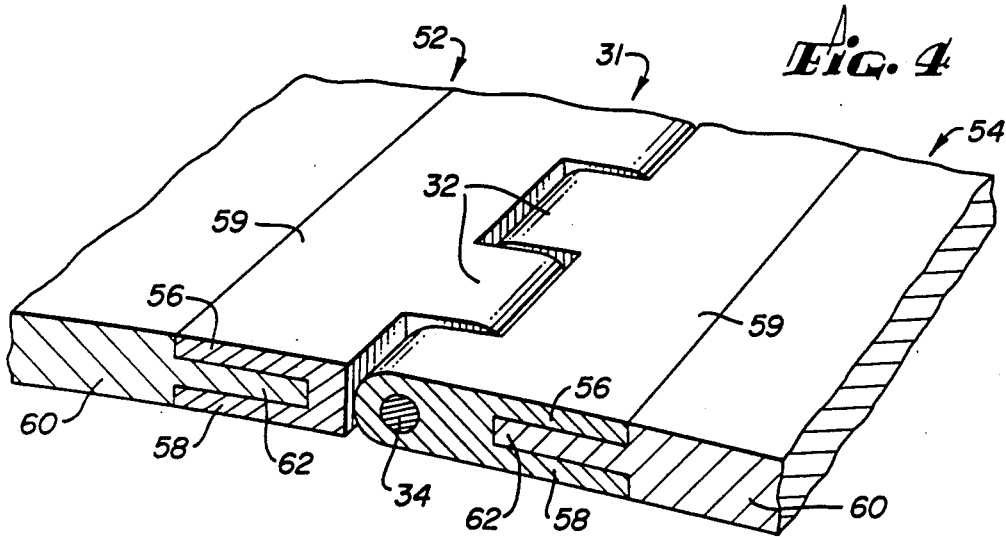
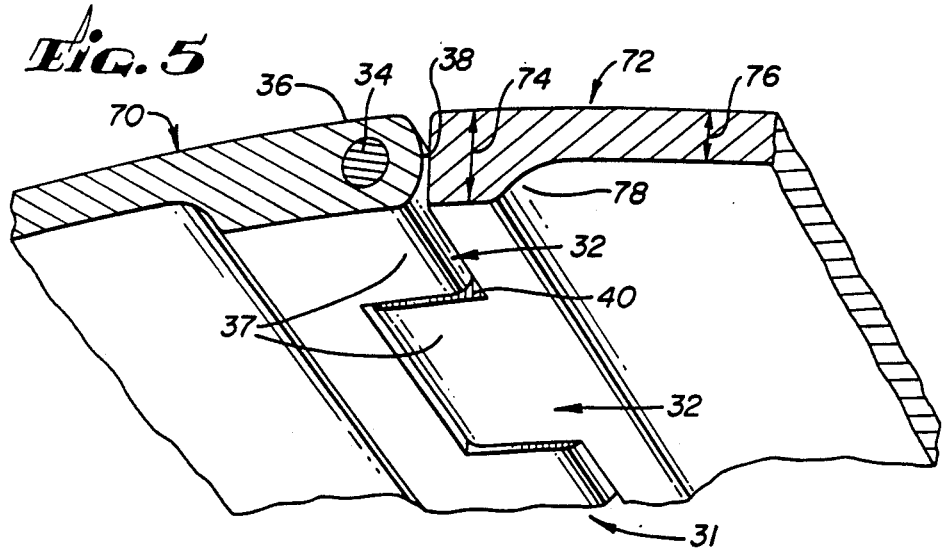

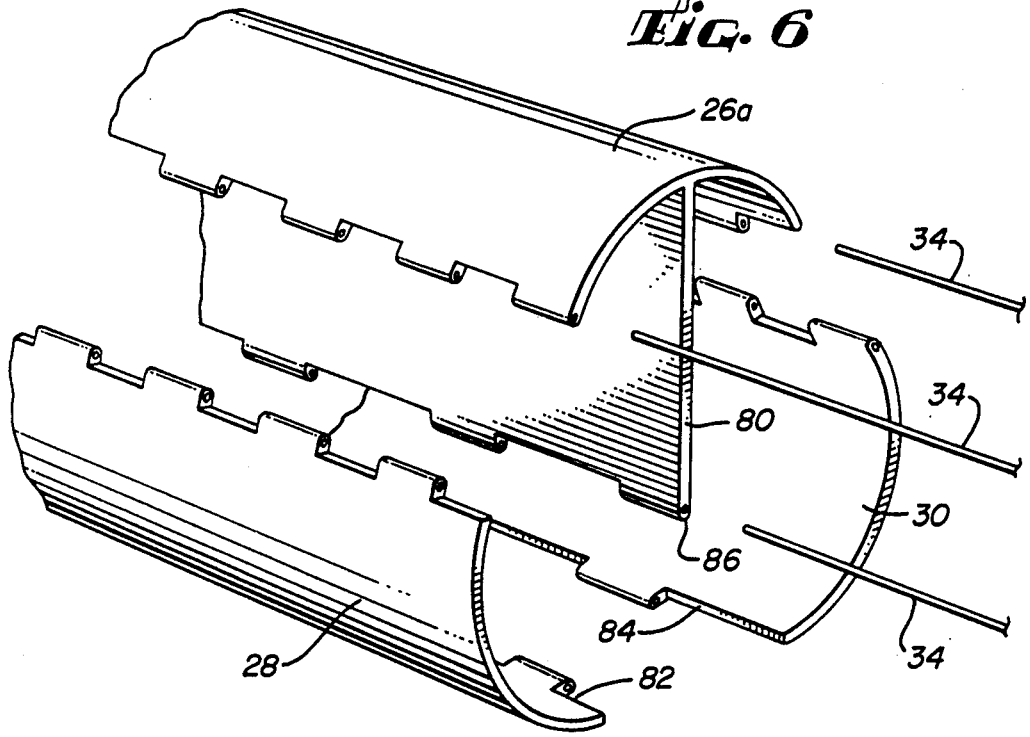
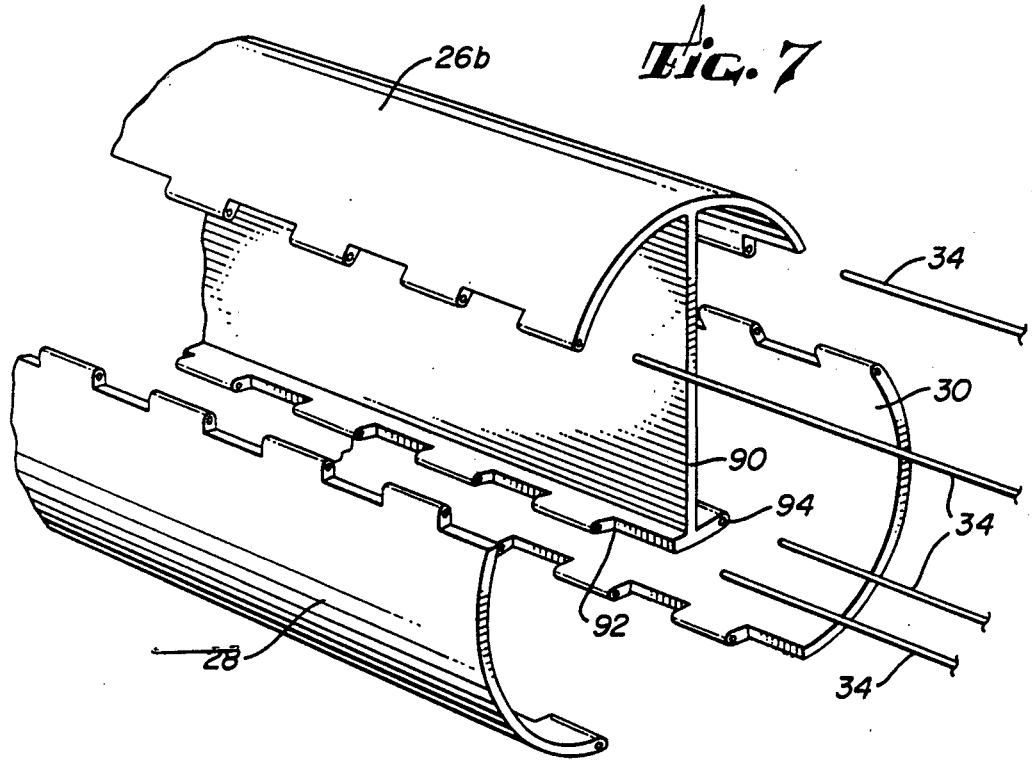

RAPID ASSEMBLY AND LOAD DISTRIBUTION SYSTEM FOR NESTABLE CONTAINER SECTIONS

BACKGROUND OF THE INVENTION

1. Cross-Reference to Related Application

This is a continuation of copending application Ser. No. 138,594, filed on Dec. 28, 1987, now abandoned, which is a continuation-in-part application of U.S. Pat. Application Serial No. 06/826,283 filed Feb. 5, 1986, now abandoned.

2. Field of the Invention

This invention relates to aircraft fuel tanks and, more particularly, to nestable aircraft external fuel tanks that may be quickly assembled and disassembled.

3. 3. Description of the Related Art

In conjunction with its military air operations, the United States Navy stores external aircraft fuel tanks aboard its aircraft carriers for extending the flight range of its carrier-based aircraft. The external fuel tanks used on carrier-based aircraft must be capable of withstanding a variety of loads. Carrier operations include rapid acceleration from a catapult launch that virtually throws an aircraft off the flight deck and includes the violent landing and sudden braking from an arresting cable. In addition, the tank is subjected to the usual flight loads and environmental conditions to which all external stores are exposed.

The number of external aircraft fuel tanks that can be stored on a carrier is limited because of the extreme bulkiness of the fuel tanks and the limited storage space aboard a carrier. As a result of this problem, the Navy has suggested disassembling aircraft fuel tanks into storable sections that can be assembled on board ship for combat-readiness support. See "Physical Distribution System for Aircraft External Fuel Tanks - Survey," Report No. CMLD-CR-47-85, SRI Final Report 8345, June 1985 (hereinafter the "SRI Report"). The basic functional requirements discussed in the SRI Report include the provision of a tank that can contain 200 to 400 gallons of fuel and that has attachment provisions for securely fastening the external fuel tank to an aircraft wing or fuselage. The fuel tank also must be capable of ejection, so that the pilot may jettison the fuel tank when empty or partially full. The tanks must also withstand the internal pressure due to the normal pressurization of fuel in the tank. Of course, the tank must endure the forces encountered from carrier catapult launches, arrested landings, and flight acceleration or "9" forces. The fuel tank also must include the usual fuel transfer mechanisms including fuel level and pressure transducers, plumbing, and valves for disconnecting the tank with the aircraft and for venting or dumping fuel. The tanks must be safe, in that they should radiate no toxic fumes, be rupture-proof, shatter-proof, and non-flammable, and be able to withstand high fuel afterburner temperatures. The fuel tank also must meet requirements for storage density and fuel tank assembly time, the goal for assembly time aboard ship being six minutes. Among others, the SRI Report lists objectives of minimum weight, minimum cost, durability, temperature resistance, and non-toxicity.

The SRI Report suggests many conventional concepts of joining the aircraft fuel tank sections upon assembly. These concepts include lap joints using adhesives; composite windings; circumferential clamps; mechanical fasteners such as bolts and rivets; robotic welding of metallic tank elements; explosive welding; and mounting plates. These conventional concepts of joining tank sections suffer from the disadvantage of requiring excessive time and manpower for assembly. Some of the concepts also involve hazardous methods or materials. In preparing the SRI Report, many persons who are skilled in the art were contacted, including most of the major United States defense aircraft manufacturers. Although the SRI Report discusses all manner of assembly configurations, it does not discuss the concept of the present invention. An object of the present invention is to provide an aircraft external tank comprising nestable sections that may be assembled and disassembled with minimum time and manpower.

SUMMARY OF THE INVENTION

The present invention achieves the above objective of minimum time and manpower assembly of nestable sections by using a load carrying pin-knuckle joint to join the sections together. In accordance with the present invention, an aircraft external fuel tank is formed from a plurality of tank sections whose common boundaries are joined together by a hinge-like coupling with interdigitating, generally rectangular knuckles, or lugs, disposed along the length of the tank section common boundaries. The knuckles each have a hole that is parallel to the tank section common boundary. The knuckles follow the curved contour of the tank surface.

The tank sections form a generally cylindrical fuel tank, in which a fuel tank liner or bladder and other fuel transfer mechanisms may be carried. Preferably, the bladder is flexible and conforms to the internal shape of the tank. In this way, the bladder does not have to sustain the structural loads of the tank of the present invention. The load carrying joint allows the tank structure to sustain the full structural loads specified by the operating requirements, rather than the bladder. The fuel tank is assembled by interdigitating or engaging the knuckles and then securing the sections together by inserting a pin through the holes of the interdigitated knuckles. The pin must be flexible enough to conform to the curved contour of the tank while being inserted through all of the interdigitated knuckles. The pin also must be strong enough to hold the tank sections together under full operational loads. The tank sections may form either longitudinal or radial sections of the tank.

The knuckles are integrally formed as part of the hinge coupling so as to be substantially flush with the outer skin of the fuel tank. In this way, when the fuel tank is assembled, the outer surface of the fuel tank presents a smooth, aerodynamic surface. Furthermore, the knuckles can withstand the forces to which they are subjected without being torn apart. In a preferred embodiment, the internal surface of the assembled tank is also smooth so as to resist internal pressure from the fuel tank and preclude any tearing or other damage to the fuel bladder.

Because of the significant loads involved, the hinge knuckles are preferably drilled or machined from a solid piece of metal. In the case of typical pin-knuckle hinges designed for low load levels, the hinge knuckles consist of a metal plate or tab bent around on itself into the shape of a cylinder so as to form a knuckle. In contrast, a solid knuckle formed in the manner of the present invention is very strong, and capable of withstanding the extreme forces to which an external fuel tank is subjected.

The hinge of the present invention is subjected to tension forces tending to tear apart the hinge and pin. These tension forces can be greater than one ton per linear inch of the hinge. In order to resist these forces, there are four structural design dimensions that are of critical importance and that are interrelated to each other so that a design can be achieved that will accommodate the structural loads and assembly requirements. One dimension is the linear width of each hinge knuckle along the boundary of the tank section. The shorter this linear distance, the greater the number of hinge knuckles along the joint and therefore the greater the difficulty in fabricating and producing the joint itself and assembling the sections into a tank. The width of the hinge knuckles establishes the strength requirement and diameter of the pin because of the tension load per inch across the joint.

The second critical structural design dimension is the diameter of the hinge pin. The pin diameter must be small enough to allow the pin to flex during insertion of the pin through the interdigitated knuckles so as to conform to the contour of the tank and hinge joint by bending, but also must be large enough for the shear strength required to withstand the joint tension forces of more than 2500 pounds per linear inch.

The last two critical structural design dimensions relate to the thickness of the hinge knuckle area around the pin hole; these dimensions are the thickness of the hinge knuckle between the pin hole and the lateral surface of the hinge knuckle on both the outer surface and inner surface of the fuel tank, both of which must withstand the joint load of 2500 pounds per inch in tension; and the distance from the pin hole to the edge of the hinge knuckle that abuts the adjacent fuel tank section, which must withstand the same joint load under shear-out stresses. These design dimensions must be selected to withstand the joint loads in conjunction with the strength of the material used for the hinge, balancing the desire for great strength with the desire for compactness, light weight, and pin flexibility.

BRIEF DESCRIPTION OF THE DRAWINGS

The invention will now be described with reference to the accompanying drawings, in which like reference numerals refer to like elements, and wherein:

FIG. 1 is a perspective view of an aircraft fuel tank in accordance with the present invention;

FIG. 2 is an exploded perspective view of the aircraft fuel tank;

FIGS. 3, 4, and 5 are perspective sectional views of various embodiments of the hinge joint; and FIGS. 6 and 7 are perspective exploded sectional views of two embodiments of the present invention having a keel structure.

DETAILED DESCRIPTION OF THE DRAWINGS

The following description is of the best presently contemplated mode of carrying out the present invention. This description is made for the purpose of illustrating the general principles of the invention and is not to be taken in a limiting sense. The scope of the invention is best determined by reference to the appended claims.

FIG. 1 shows a perspective view of an aircraft external fuel tank in accordance with the present invention.

The fuel tank 10 comprises a generally cylindrical, tapered center section 12 to which is attached a nose cone 14 and a tail cone 16. The nose cone and tail cone provide a streamlined, aerodynamic shape to the fuel tank. The center section includes pipe fittings 20 and 22 that mate with fuel connections on the underside of the aircraft fuselage or wing in order to supply air for pressurization of the fuel and to allow fuel to be drawn out of the tank. The center section may also include a plurality of mounting receptacles 24 into which a mounting bolt, hook or pin may be inserted in order to securely fasten the fuel tank to the aircraft.

FIG. 2 shows an exploded perspective view of the fuel tank of FIG. 1. In particular, the center section 12 is shown disassembled into its component parts. The center section is shown as comprising three separate curved longitudinal tank sections 26, 28, and 30, but the center section may be comprised of a different number of tank sections or may be comprised of axially spaced tank sections without departing from the spirit of the invention. When the tank is disassembled, the various tank sections may be stacked or nested on top of one another, thus alleviating the problem of limited storage space on an aircraft carrier. Preferably, the tank includes a fuel liner or bladder 29 that is impervious to fuel. The liner may be, for example, a flexible plastic fuel bladder. The flexibility of the bladder would allow the bladder to conform to the interior shape of the fuel tank and fill the interior volume. The liner is carried within the tank such that it can accept and contain the fuel. In this way, fuel will not seep through the hinge joint 31. Once the tank is assembled, fuel may be pumped into the liner 29. Generally, the liner is fixed to a tank section, but may also be detachable from the fuel tank structure for increased tank nestability and easier repair and storage.

A top-most tank section 26 extends the length of the center section 12 and extends symmetrically from the fuel tank centerline. The top center tank section 26 may incorporate a strengthened reinforcement plate 27, or strongback, at the top. The strongback, for example, may be a plate attached to the inside surface of the top-most tank section 26 or may be simply an extra thickness of the material from which the section 26 is constructed. For example, the strongback may be constructed of a carbon fiber composite or of aluminum. The strongback 27 serves as a reinforcement in order to distribute the stress on the tank at the point of attachment to the aircraft. The strongback can also support internally mounted elements, such as fuel system plumbing and fuel pressure and level transducers.

When the tank is assembled, the common longitudinal boundaries of the tank sections form a hinge joint or pin and knuckle joint 31. Generally rectangular knuckles or lugs 32 extending from the tank section are provided along the length of the common boundary and are formed as a solid structure with a hole passing through each knuckle parallel to the common boundary. The knuckles of one tank section interdigitate with the opposing knuckles of an adjacent tank section. Once the knuckles have been interdigitated and the tank sections abut each other along the common boundary, a hinge pin 34 may be inserted through the knuckles along the entire length of the common boundary. Thus, the pin 34 must be flexible enough to curve and fit through all of the interdigitated knuckles and follow the contour of the tank. The hinge pin may be constructed, for example, from steel, aluminum, titanium or multi-strand filament.

FIG. 3 shows a sectional perspective view of a portion of a disassembled hinge joint including a portion of two tank sections 28, 30 with hinge knuckles or lugs 32 disposed along the hinge joint. Each hinge knuckle 32 has a top surface 36, a bottom surface 37 not visible in FIG. 3, a curved end surface 38 joining the top surface and bottom surface, and side surfaces 40. A hole 42 is provided in each hinge knuckle 32 through which the hinge pin 34 may be inserted. The hole 42 may be formed in the knuckle, for example, by being drilled or machined from the solid material comprising the knuckle. When the tank sections 28 and 30 are joined together so that the hinge knuckles 32 are interdigitated and the holes 42 are aligned, the holes 42 in each of the hinge knuckles line up to form a cylindrical passageway for the hinge pin 34. Preferably, the hinge pin extends the length of the entire joint, so that a single hinge pin may be passed through the holes 42 of each knuckle, thereby coupling the tank sections 28 and 30 together.

Because the hinge knuckles must interdigitate with the hinge knuckles of the adjacent tank section, each hinge knuckle should have the same dimensions as the others and the longitudinal dimension 44 of each hinge knuckle should equal the longitudinal spacing 46 of the hinge knuckles for each tank section. Each hinge knuckle has a height or thickness indicated by reference numeral 48, and a lateral extent 50. The critical structural design dimensions for proper strength of the hinge joint are: (1) the diameter of the hole 42; (2) the distance of the hole 42 to the curved end face 38; (3) the longitudinal extent 44 of the knuckle; and (4) the distance from the hole 42 to the top surface 36 of the knuckle and to the bottom surface of the knuckle. These dimensions must be selected so as to withstand the forces acting upon the hinge joint and must be selected in conjunction with the strength of the material used for fabrication of the joint itself. In addition, the dimensions must be selected to facilitate rapid assembly.

FIGS. 4 and 5 show alternate embodiments of the present invention and illustrate that the hinge knuckles are integrally formed with the hinge joint. FIG. 4 shows two tank sections 52 and 54 joined together by a hinge joint 31 with a hinge pin 34 in the manner previously described. The hinge joint extends beyond the knuckles themselves, and may be said to comprise the knuckles 32 disposed along the tank section common boundary and a hinge element 59 joining each knuckle of a tank section and extending away from the knuckles. The hinge knuckles 32 of each tank section are integrally formed with the hinge element. The top surface of the joint 31 is a smooth, curved planar surface.

FIG. 4 also illustrates that the tank sections are not necessarily constructed completely of the same material as the hinge joint itself. In the embodiment illustrated in FIG. 4, the hinge element 59 of each tank section is provided with parallel, planar extensions 56 and 58 forming a valley between them. A wall portion 60 of the tank section may be inserted into the hinge element valley. Alternatively, the wall portion may include a valley into which a solid, planar hinge element may be inserted. A honeycomb core structure comprising a honeycomb composite material sandwiched between two layers of wall material may be used for the wall portion 60 and is provided with an extension or tongue 62 of reduced thickness that fits into the space between the hinge element extensions 56 and 58. This arrangement provides a strong coupling of the hinge element and the honeycomb wall portion, resulting in a composite structure that resists the bending forces in the region where the tank section joins the hinge, while preserving a smooth, flush outer surface for the fuel tank. Alternatively, the outer surface of planar extension 56 may slope downward to the tank section 60 so as to comprise a gradually reducing thickness that meets a wall portion having a uniform thickness. The choice of material used for the wall 60 depends on the relative importance of weight savings, cost, resistance to fire, resistance to damage from ballistic impact, and resistance to corrosion.

FIG. 5 shows tank sections 70 and 72 joined together by a hinge joint 31 with hinge pin 34 in the manner previously described. The hinge joint 31 includes a plurality of knuckles 32, each knuckle having a top surface 36, bottom surface 37, end surface 38, and side surfaces 40. The outer surface of the joint is aerodynamically smooth, as with previous embodiments. The inner surface of the joint, however, has a tapered, reduced thickness away from the immediate region of the hinge knuckles 32. The embodiment of FIG. 5 shows that the hinge joint thickness 74 at the knuckles may be greater than the joint thickness 76 at an area removed from the hinge knuckles. Between the areas of differing thickness, the inside surface of the hinge joint is smoothly tapered at 78. This allows for reduced weight while providing the strength needed for the hinge joint.

FIGS. 6 and 7 show alternate embodiments of the present invention in which the top center tank section includes a keel structure. It is to be understood that these figures show only a section of the tank and therefore the curvature of the individual tank sections is not apparent in FIG. 6 and FIG. 7. It is to be understood, however, that the longitudinal boundaries of the tank sections follow the curved contour of the tank. In FIG. 6, the keel structure 80 consists of a planar member extending from the inner surface of the tank at the centerline of the top tank section 26a. The keel structure provides increased stiffness and rigidity to the assembled tank. The side tank sections 28 and 30 are coupled to the top center tank section 26a as with the embodiment illustrated in FIG. 2. The lower boundaries 82, 84 of the tank sections 28, 30, respectively, are coupled to the bottom edge 86 of the keel structure 80 in addition to being joined to each other. Thus, rather than having alternating hinge knuckles on the bottom edges with the equal spacing illustrated in FIG. 3, these sections are configured such that the knuckles from the three different sections can interdigitate and be held together by a hinge pin 34. For example, between each knuckle of a given tank section there will be fitted a knuckle from each of the other two tank sections.

An alternate embodiment of the fuel tank top center section is shown in FIG. 7. In this embodiment, the top center tank section 26b includes a keel structure comprising a planar member 90 extending from the centerline of the top tank section, as with the embodiment of FIG. 6, except that the member 90 has a laterally extending, flared bottom or "winged keel" with two parallel rows of hinge knuckles 92 and 94. The first row of hinge knuckles 92 on the winged keel interdigitate with the knuckles on the tank section 28, while the second row of hinge knuckles 94 on the winged keel interdigitate with the knuckles on the other tank section 30. Thus, a total of four hinge pins 34 will be required for this fuel tank.

The presently disclosed embodiments are to be considered in all respects as illustrative and not restrictive. The scope of the invention is best indicated by the appended claims rather than the foregoing description, and therefore it is intended that the claims embrace all changes which come within the meaning and range of equivalency of the claims.

What is claimed is:

1. A aircraft fuel tank that maybe quickly assembled and disassembled, comprising:
    at least two separable tank sections that abut each other along common boundaries, each tank section having an outer surface and an inner surface;
    a plurality of substantially rectangular extensions spaced at generally uniform intervals along each tank section common boundary, wherein each extension has an outer and inner surface which are contiguous with the tank section outer surface and inner surface, respectively, and wherein each extension has a solid metal construction with a hole passing through the extension in a direction parallel to the common boundary and spaced substantially equidistant between the inner and outer surface of the extension, such that the extensions of abutting tank sections may be fitted together with the extension of one tank section fitting into an interval of the abutting tank section having no extension; and
    a flexible pin adapted to be inserted through the extension of two adjacent tank sections, thereby coupling the tank sections together.

2. An aircraft fuel tank as set out in claim 1, wherein the holes of the hinge elements are of a type formed by drilling or machining the solid metal knuckles.

3. An aircraft fuel tank as set out in claim 1, wherein a single pin is provided for each common boundary, each said pin having a flexible construction and a diameter sufficient to withstand 2500 pounds tension per linear inch.

4. An aircraft fuel tank, comprising:
    at least two separable tank sections joinable at common boundaries, each tank section having an outer surface and an inner surface and including a plurality of spaced apart load bearing knuckles disposed along the tank section common boundaries, each of said knuckles having an outer surface and an inner surface that are joined to the tank section outer surface and inner surface, respectively, each knuckle being of a solid metal construction and having a hole passing therethrough that is parallel to the knuckle inner and outer surfaces and is positioned substantially equidistant between the knuckle inner and outer surfaces, the tank further comprised of a generally planar keel section extending across the interior of the fuel tank and having an edge boundary including a plurality of knuckles interdigitated with the knuckles of a common boundary of two tank sections, each keel knuckle having a solid metal construction and a hole passing therethrough, the tank further including a single flexible pin for each tank section common boundary adapted to be inserted through the hole in each of the knuckles of adjoining tank sections and keel section, thereby coupling the tank sections and keel section together.

5. A rapid assembly and disassembly aircraft fuel tank, comprising:
    at least two separable tank sections having a predetermined thickness, each tank section having a curved outer surface and a curved inner surface that are joined at their edges, thereby forming the boundaries of each tank section, the tank sections being joinable along common boundaries, the separable tank sections having a plurality of knuckles disposed along the tank section common boundaries;
    a generally planar keel structure extending from one of the tank sections and having an edge boundary including a plurality of knuckles;
    the knuckles of a first tank section interdigitating with the knuckles of an adjacent second tank section and the knuckles of the keel structure at a keel/tank section common boundary, each knuckle having a hole formed through its thickness parallel to its respective tank section or keel section boundary such that the holes in the knuckles of the first and second tank sections and keel section align to form a common cylindrical passageway when the knuckles are interdigitated; and
    a flexible pin adapted for insertion through the entire length of the cylindrical passageway formed by the holes in the knuckles of the first and second tank sections and keel section such that the knuckles and pin comprise a load bearing hinge joint coupling the tank sections and keel section together.

6. The fuel tank of claim 5 having at least three tank sections, a first tank section having a keel structure, wherein the keel structure edge boundary includes first and second parallel rows of knuckles that interdigitate with the knuckles of a second and third tank section, respectively.

7. The fuel tank of claim 6 wherein the first tank section includes a strongback, to which the keel structure is attached.

8. An aircraft fuel tank as set out in claim 5, wherein said knuckles of said first and second tank sections and said keel knuckles engage at said keel/tank boundary to form a T-shaped interdigitated structure and wherein said knuckles of said first and second tank sections are spaced to accommodate said keel knuckles.

9. A rapid assembly and disassembly aircraft fuel tank comprising:
    at least two separable tank sections joinable along common boundaries, the tank section between the common boundaries including a wall portion having an outer surface and an inner surface;
    a plurality of hinge receiving sections disposed along each tank section common boundary;
    a substantially planar hinge element coupled to each hinge receiving section along a tank section common boundary and having an outer hinge surface that is joined to and contiguous with the outer surface of the wall portion of the tank section, thereby forming a smooth outer surface and an inner hinge surface, said hinge elements being formed of a solid metal construction with a hole extending therethrough parallel to said planar outer surface and positioned approximately equidistant between said hinge inner and outer surfaces; and
    a flexible pin inserted through the holes in the hinge elements of two adjacent tank sections, thereby coupling the tank sections together.

10. The fuel tank of claim 9 wherein at least one hinge element includes a groove along its length opposite the knuckles for insertion of the wall portion.

11. The fuel tank of claim 9 wherein the hinge element includes two parallel, planar extensions along its length opposite the knuckles thereby creating a valley space into which a tank wall portion may be inserted.

12. The fuel tank of claim 9 wherein the hinge element has a first thickness in the area adjacent the knuckles and has a second, lesser thickness in an area spaced away from the knuckles.

13. The fuel tank of claim 9 wherein the wall portions are formed of a honeycomb composite structure.

14. The fuel tank of claim 9 wherein the tank sections extend longitudinally along the length of the tank.

15. The fuel tank of claim 9 wherein the tank includes a strongback incorporated at the top centerline of the tank for distributing the attachment load stresses applied by attachment of the tank to the aircraft.

* * * * *